United States Patent
Slat

(10) Patent No.: US 6,645,575 B2
(45) Date of Patent: Nov. 11, 2003

(54) METHOD FOR MAKING A MULTI-LAYER PLASTIC CONTAINER HAVING A CARBON-TREATED INTERNAL SURFACE

(75) Inventor: William A. Slat, Brooklyn, MI (US)

(73) Assignee: Plastipak Packaging, Inc., Plymouth, MI (US)

( * ) Notice: Subject to any disclaimer, the term of this patent is extended or adjusted under 35 U.S.C. 154(b) by 131 days.

(21) Appl. No.: 09/968,374

(22) Filed: Oct. 1, 2001

(65) Prior Publication Data

US 2002/0028304 A1 Mar. 7, 2002

Related U.S. Application Data

(62) Division of application No. 09/370,642, filed on Aug. 6, 1999, now Pat. No. 6,475,579.

(51) Int. Cl.[7] .............................. B05D 7/22; B05D 5/00; C23C 16/26; C23C 16/505; C23C 16/511
(52) U.S. Cl. .................. 427/577; 427/575; 427/237; 427/238; 427/249.1; 427/412.1
(58) Field of Search ................................ 427/569, 575, 427/577, 237, 238, 249.1, 412.1, 412.3, 412.5; 215/12.1; 428/35.7, 36.6

(56) References Cited

U.S. PATENT DOCUMENTS

| | | | |
|---|---|---|---|
| 4,756,964 A | 7/1988 | Kinciad et al. ............. 428/408 |
| 5,190,807 A | 3/1993 | Kimock et al. ............. 428/216 |
| 5,308,649 A | 5/1994 | Babacz ........................ 427/562 |
| 5,320,889 A | * 6/1994 | Bettle, III .................. 428/36.6 |
| 5,378,510 A | 1/1995 | Thomas et al. ............. 427/563 |
| 5,464,106 A | 11/1995 | Slat et al. ..................... 215/12 |
| 5,521,351 A | 5/1996 | Mahoney .................... 219/121 |
| 5,565,248 A | 10/1996 | Plester et al. ............... 427/571 |
| 5,670,224 A | 9/1997 | Izu et al. ...................... 428/35 |
| 5,677,010 A | 10/1997 | Esser et al. ................. 427/489 |
| 5,690,745 A | 11/1997 | Grünwald et al. .......... 118/723 |
| 5,702,770 A | 12/1997 | Martin ........................ 427/475 |
| 5,733,484 A | 3/1998 | Uchida et al. ................ 264/29 |
| 5,736,093 A | 4/1998 | Slat ............................. 264/513 |
| 5,766,712 A | 6/1998 | Darr et al. ..................... 428/36 |
| 5,798,139 A | 8/1998 | Nagashima et al. ........ 427/237 |
| 5,849,366 A | 12/1998 | Plester ........................ 427/491 |
| 5,853,833 A | 12/1998 | Sudo et al. ................. 428/36.6 |
| 5,900,285 A | 5/1999 | Walther et al. ............. 427/491 |
| 6,217,959 B1 | * 4/2001 | Slat ............................ 428/35.7 |
| 6,461,699 B1 | * 10/2002 | Slat et al. ................... 428/35.7 |
| 6,495,226 B1 | * 12/2002 | Slat ............................ 428/35.7 |
| 6,524,672 B1 | * 2/2003 | Slat et al. ................... 428/35.7 |
| 6,534,139 B1 | * 3/2003 | Gibbons et al. ........... 428/35.7 |
| 6,548,133 B2 | * 4/2003 | Schmidt et al. ............ 428/35.7 |
| 6,554,146 B1 | * 4/2003 | DeGroff et al. ............. 215/381 |
| 2001/0055657 A1 | * 12/2001 | Slat ............................ 428/35.7 |
| 2002/0127333 A1 | * 9/2002 | Slat ............................ 427/237 |
| 2003/0091769 A1 | * 5/2003 | Slat et al. ................... 428/35.7 |

* cited by examiner

*Primary Examiner*—Marianne Padgett
(74) *Attorney, Agent, or Firm*—Rader, Fishman & Grauer PLLC

(57) ABSTRACT

A method is provided for making a blow molded multi-layer container having an upper wall portion, including an opening; an intermediate sidewall portion positioned beneath the upper wall portion; and a base portion positioned beneath the intermediate sidewall portion. The container includes (i) a molded inner layer formed from a plastic material, the inner layer having a vertical length and a carbon-treated inner surface; and (ii) a molded outer layer formed from recycled plastic that is substantially coextensive with the inner layer. The recycled outer layer comprises at least 40% by weight of the overall weight of the container, but can comprise more than 90% by weight. In a preferred embodiment, the thickness of the inner and/or outer layers is controllably adjusted along their respective vertical lengths. If functionally desirable, the inner layer and/or outer layer may also include additional barrier materials and/or oxygen scavenging/reacting materials.

26 Claims, 3 Drawing Sheets

METHOD FOR MAKING A MULTI-LAYER PLASTIC CONTAINER HAVING A CARBON-TREATED INTERNAL SURFACE

This application is a division of application Ser. No. 09/370,642, filed Aug. 6, 1999, now U.S. Pat. No. 6,475,579.

TECHNICAL FIELD

The present invention relates to multi-layered containers. More particularly, the present invention relates to blow molded multi-layer plastic containers having a carbon-treated internal surface and a method for making such containers.

BACKGROUND ART

Multi-layer plastic containers are commonly used for packaging items in a wide range of fields, including food and beverage, medicine, health and beauty, and home products. Plastic containers are known for being easily molded, cost competitive, lightweight, and generally suitable for many applications. Multi-layered containers provide the added benefit of being able to use different materials in each of the layers, wherein each material has a specific property adapted to perform a desired function.

Because plastic containers may permit low molecular gases, such as oxygen and carbon dioxide, to slowly permeate through their physical configurations, the use of plastic containers sometimes proves to be less desirable when compared to containers formed from other less permeable materials, such as metal or glass. In most applications, the shelf life of the product contents is directly related to the package's ability to effectively address such molecular permeation. In the case of carbonated beverages, such as beer, oxygen in the atmosphere surrounding the container can gradually permeate inwardly through the plastic walls of the container to reach inside of the container and deteriorate the contents. Likewise, carbon dioxide gas associated with the contents may permeate outwardly through the plastic walls of the container until eventually being released on the outside, causing the carbonated beverage to lose some of its savor and possibly become "flat."

To address some to the foregoing concerns, plastic container manufacturers have utilized various techniques to reduce or eliminate the absorption and/or permeability of such gases. Some of the more common techniques include: increasing the thickness of all or portions of the walls of the container; incorporating one or more barrier layers into the wall structure; including oxygen-scavenging or reacting materials within the walls of the container; and applying various coatings to the internal and/or external surface of the container. However, a number of conventional barrier and/or scavenger materials will not effectively curtail the permeation of both oxygen and carbon dioxide over extended periods of time. Moreover, there are usually other practical concerns associated with most conventional techniques, most commonly, increased material costs and/or production inefficiencies.

In recent times, the use of plastics has become a significant social issue. Recycling has become an increasingly important environmental concern and a number of governments and regulatory authorities continue to address the matter. In a number of jurisdictions, legislation pertaining to minimum recycled plastic content and the collection, return, and reuse of plastic containers has either been considered or has already been enacted. For example, in the case of plastic containers used to hold consumable items, such as food items or beverages, regulations often require a certain content and minimum thickness of the innermost layer that comes in contact with the contents. Conventional processes, such as co- or multiple-injection molding, are often limited as to the amount of recycled plastic that can be effectively incorporated into the structure of the container. Commonly, the amount of recycled content that can be effectively incorporated into conventional co-injection molded containers that are suitable for food contents is less than 40% of the total weight of the container.

Therefore, a need exists in the industry for an improved multi-layered plastic container having a high recycled content that is suitable for holding carbonated products, such as carbonated beverages, and provides an acceptable level of performance when compared to commercial containers formed from alternative materials. A further need exists for a method to produce such containers in high volume commercial rates using conventional equipment.

DISCLOSURE OF INVENTION

Recognizing the problems and concerns associated with conventional multi-layered plastic containers, especially those used to hold carbonated beverages, a multi-layer plastic container having enhanced gas barrier properties and a high content of recycled plastic is provided. A container constructed in accordance with the principles of the present invention provides several advantages over those previously available. Such advantages are generally realized through the use of a both a carbon coating on the internal surface of an inner layer, wherein the inner layer may have a controllably-varied thickness and a significant amount of outer recycled content. Furthermore, the improved container can be produced using conventional processing techniques and manufacturing equipment.

An important aspect of the present invention is its ability to incorporate the functional benefits of an exceptionally thin, but very effective, barrier with the functional and commercial benefits associated with having an outer layer comprised a significant amount of recycled plastic content. Further, the ease in subsequently recycling a container produced in accordance with the principles of the present invention make the practice of the invention extremely advantageous. Moreover, the present invention provides the additional advantage of permitting the manufacturer to controllably vary the material positioning and wall thickness at any given location along the vertical length of the inner and/or outer layers of the container.

In accordance with the principles of the present invention, a blow molded multi-layer container is provided having an upper wall portion, an intermediate sidewall portion positioned beneath the upper wall portion, and a base portion positioned beneath the intermediate sidewall portion, the base portion being adapted to dependently or independently support the container. The container includes (i) a molded inner layer formed from a plastic material, the inner layer having a vertical length and a carbon-treated inner surface; and (ii) a molded outer layer formed from recycled plastic that is substantially coextensive with the inner layer. The recycled outer layer comprises at least 40% by weight of the overall weight of the container, but can comprise more than 90% by weight, depending upon the needs of the application. In a preferred embodiment, the thickness of the inner and/or outer layers is controllably adjusted along their respective vertical lengths. If functionally desirable, the inner layer and/or outer layer may also include additional barrier materials and/or oxygen scavenging/reacting materials.

Other and further advantages and novel features of the invention are readily apparent from the following detailed description of the best mode for carrying out the invention when taken in connection with the accompanying drawings, wherein, by way of illustration and example, embodiments of the present invention are disclosed.

BEST MODE FOR CARRYING OUT THE INVENTION

Figure 1:
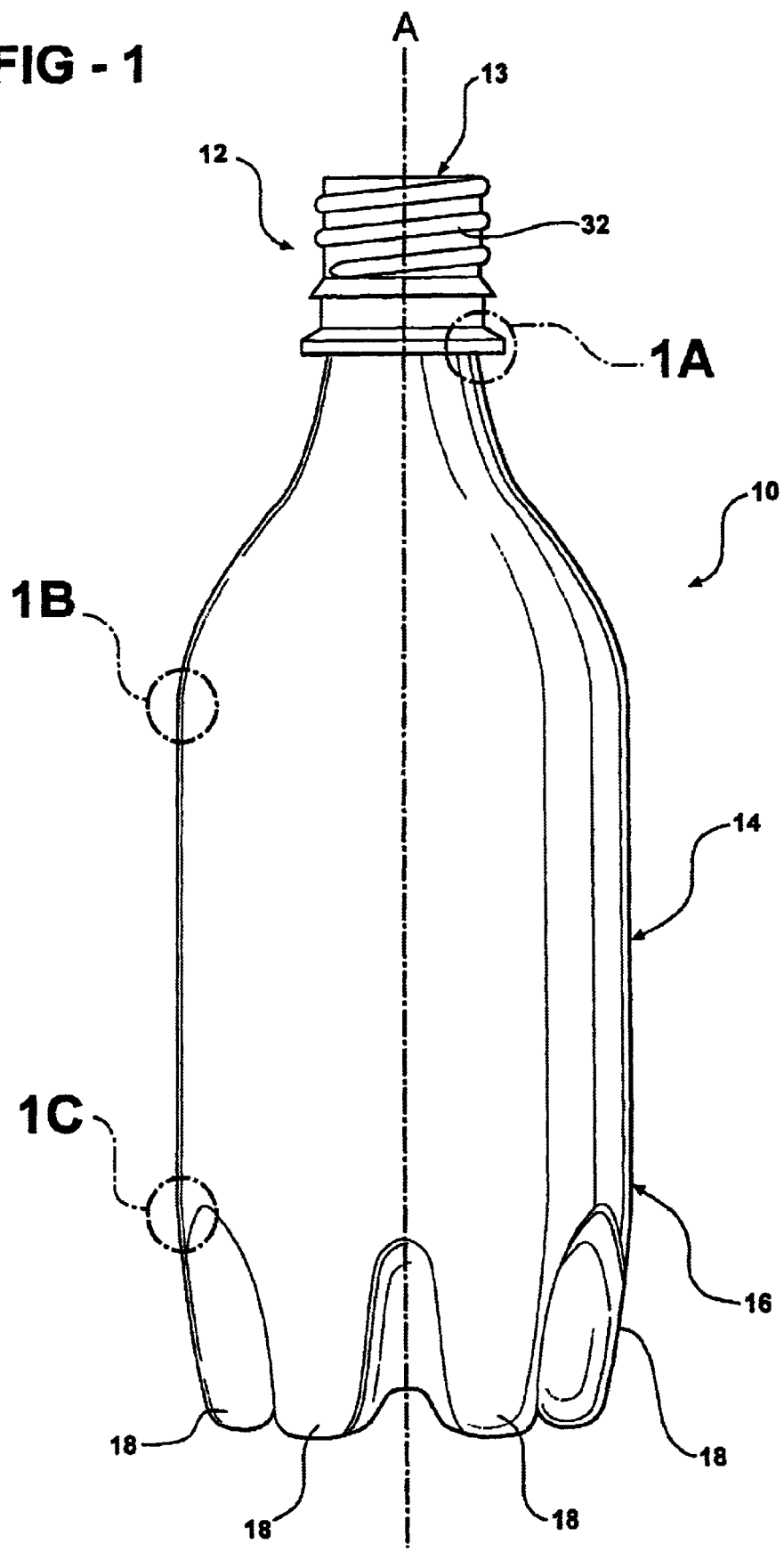
FIG. 1 is an elevation view of a container in accordance with the principles of the present invention.

Referring now to the drawings in detail, wherein like reference numerals and letters designate like elements, there is shown in FIG. 1 an elevational view of a container 10 constructed in accordance with the principles of the present invention. Container 10 typically includes an upper wall portion 12, including an opening 13; an intermediate sidewall portion 14 positioned beneath the upper wall portion 12; and a base portion 16 positioned beneath the intermediate sidewall portion 14. The base portion 16 is adapted to support the container 10 either dependently, i.e., where another object such as a base cup (not shown) is used, or independently, i.e., where no other objects are needed to stand the container upright on a generally flat surface. In a preferred embodiment, the container 10 is supported by a freestanding base formed by a plurality of integrally formed feet 18, such as those illustrated in FIG. 1.

Figure 1A:
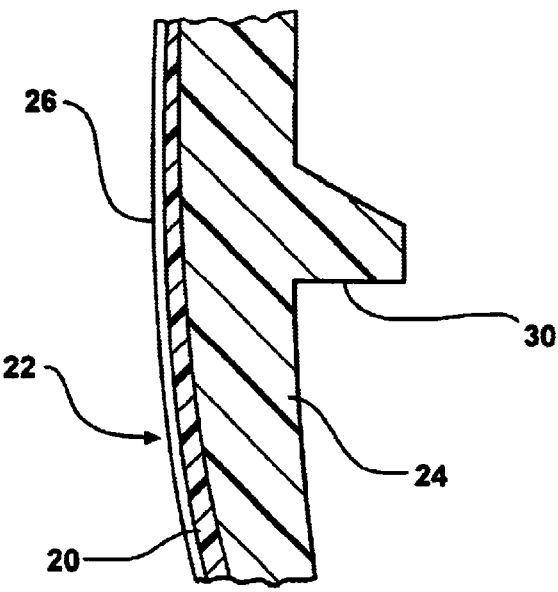
FIGS. 1A, 1B and 1C are cross-sectional and enlarged views of various areas of the container wherein the relative thicknesses of the layers forming the container are illustrated.
Figure 1B:
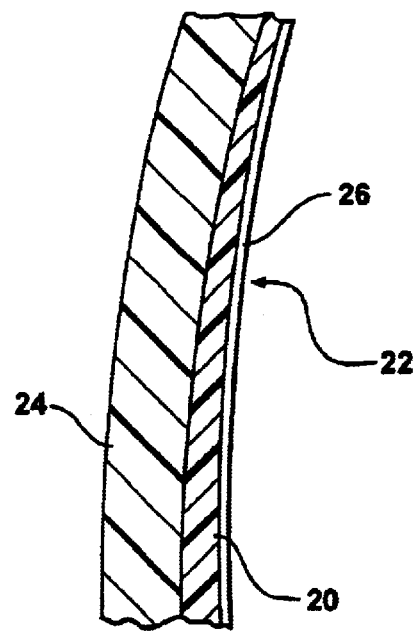
Figure 1C:
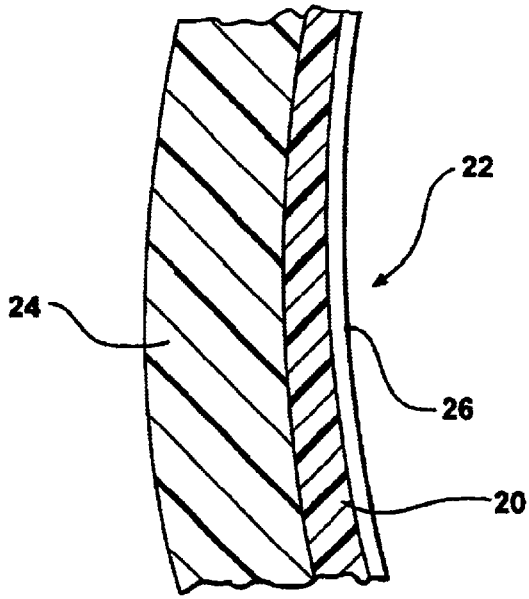

Referring to FIGS. 1A–1C, which represent enlarged detailed views of areas 1A, 1B and 1C, respectively, of FIG. 1, the container 10 includes (a) a molded inner layer 20, having a vertical length and an inner surface 22; (b) a molded outer layer 24; and (c) a central vertical axis A. The inner surface 22 of the molded inner layer 20 is at least partially coated with a thin layer or film of carbon 26. While complete encapsulation of the inner layer 20 by the outer layer 24 is not required, it is preferred that the molded outer layer 26 is substantially coextensive with the inner layer 20 and provides structural support to the walls of the container 10.

The molded inner layer 20 is comprised of a thermoplastic material. The following resins may be used as plastic materials for the inner layer 20: polyethylene resin, polypropylene resin, polystyrene resin, cycloolefine copolymer resin, polyethylene terephthalate resin, polyethylene naphthalate resin, ethylene-(vinyl alcohol) copolymer resin, poly-4-methylpentene-1 resin, poly (methyl methacrylate) resin, acrylonitrile resin, polyvinyl chloride resin, polyvinylidene chloride resin, styrene-acrylo nitrile resin, acrylonitrile-butadien-styrene resin, polyamide resin, polyamideimide resin, polyacetal resin, polycarbonate resin, polybutylene terephthalate resin, ionomer resin, polysulfone resin, polytetra fluoroethylene resin and the like. When food product contents are involved, the inner layer 20 is preferably formed from virgin polyethylene terephthalate (PET), polyethylene naphthalate (PEN), and/or blends of polyethylene terephthalate and polyethylene naphthalate. However, other thermoplastic resins, particularly those approved for contact with food products, may also be used.

The molded outer layer 24 is comprised of a recycled plastic material, including the plastics set forth in the preceding paragraph, but is commonly formed from recycled polyethylene terephthalate (PET). However, the invention is not limited to a particular type of recycled plastic and other recycled plastic materials may be used.

In a preferred embodiment, the inner layer 20 has a wall thickness, taken along its vertical length, that is in the range of 0.5 mil to 5 mil (0.0127 mm to 0.127 mm) and more preferably between 1 to 2 mils (0.0254 mm to 0.0508 mm). In some instances, such as where food product contents are involved, a minimum thickness requirement for the inner layer 20 may be specified and must be met. As illustrated in FIG. 1 and FIGS. 1A, 1B and 1C, the thickness of the inner layer may be varied along the vertical length. In this manner, different portions of the container 10 can have variably controlled thickness along the vertical length, providing improved material usage and increased design flexibility. For instance, the thickness of the inner layer 20 positioned at the upper portion 12 (such as shown in FIG. 1A) can be thinner than the intermediate sidewall portion 14 (such as shown in FIG. 1B). Likewise, the thickness of the inner layer 20 at the base wall portion 16 (such as shown in FIG. 1C) can be thicker than the thickness of the same layer in the intermediate sidewall portion 14 (such as shown in FIG. 1B).

In keeping with an aspect of the present invention, the inner layer comprises less than 0.60 by weight of the total weight of the container 10, preferably less than 0.30 of the total weight of the container 10, and more preferably, less than about 0.15 of the total weight of the container 10. The ability of the present invention to utilize an exceptionally thin inner layer 20—particularly when compared to other conventional multi-layer containers—can provide significant economic advantages and incentives, especially in instances in which virgin material is more costly and/or scarce than recycled material.

As mentioned earlier, the inner surface 22 of the inner layer 20 is coated with a thin layer of carbon 26 which provides enhanced barrier properties to the container 10. In a preferred embodiment, the carbon coating 26 is comprised of a highly hydrogenated amorphous carbon that is doped with nitrogen. The thickness of the carbon coating 26 is less than about 10 $\mu$m and the weight of the coating 26 is less than about $1/10,000^{th}$ of the total weight of the container. An important feature of the present invention is that only about 3 mg of the carbon coating 26 is needed to treat a 500 cc plastic container. Further, despite the notable thinness of the carbon coating 26, the amount of barrier protection afforded is quite significant and the protection from permeation of oxygen and carbon dioxide is favorable when compared with the protection found in metal cans and glass bottles. Initial tests have shown that the barrier provided in connection with the present invention against oxygen permeation can be more than thirty times better than that of a container formed from untreated PET; the barrier provided against carbon dioxide permeation can be more than seven times better than that of a container formed from untreated PET; and the barrier provided against the migration of total aldehydes can be more than 6 times better than untreated PET.

The molded outer layer 24 comprises at least about 0.40 by weight of the total weight of the container 10, but can comprise more than 0.90 by weight of the total weight of the container 10 for certain applications. In a preferred embodiment, the outer layer 24 has a wall thickness, taken along its vertical length, that is in the range of 6 to 23 mils (0.1524 mm to 0.5842 mm). As illustrated in FIG. 1 and FIGS. 1A, 1B and 1C, the thickness of the outer layer can also be separately and independently varied along its vertical length. In this manner, different portions of the container 10 (taken perpendicular to the central vertical axis A) can have different inner layer thicknesses, different outer layer thicknesses, and/or different overall thickness measurements, all by design. For instance, the thickness of the molded outer layer 24 positioned at the upper portion 12 (such as shown in FIG. 1A) can be much thicker than the intermediate sidewall portion 14 (such as shown in FIG. 1B). Likewise, the thickness of the outer layer 24 at the base wall portion 16 (such as shown in FIG. 1C) can be thicker than the thickness of the same layer in the intermediate sidewall portion 14 (such as shown in FIG. 1B). Because the molded outer layer 24 is generally comprised of a less expensive plastic material that does not directly contact the contents of the container 10, a less expensive material can be used to form a number of the structural integral components for the container, such as the neck flange 30 and outer threads 32 shown in FIG. 1.

While it is often unnecessary—and can complicate the recycling process—in special applications, the inner layer 20 and/or outer layer 24 may further include additional barrier materials and/or oxygen scavenging/reacting materials (not shown) that are commonly known in the art. Examples of some of the more commonly used barrier materials include saran, ethylene vinyl alcohol copolymers (EVOH), and acrylonitrile copolymers, such as Barex. The term saran is used in its normal commercial sense to contemplate polymers made for example by polymerizing vinylidene chloride and vinyl chloride or methyl acrylate. Additional monomers may be included as is well known. Vinylidene chloride polymers are often the most commonly used, but other oxygen barrier materials are well known. Oxygen-scavenging materials can include materials marketed for such a purposes by several large oil companies and resin manufacturers. A specific example of such a material is marketed under the trade name AMOSORB and is commercially available from the Amoco Corporation.

Another significant advantage of the present invention is its ability to provide significant barrier properties, incorporate a high content of recycled plastic material, and be advantageous to present day recycling. The inner layer 20 and outer layer 24 are both comprised of plastic material and can be readily recycled. Unlike a number of other barrier materials often used in connection with multi-layer containers, which can be difficult to separate, the carbon coating 26 of the present invention has no impact on the recycling of the plastic materials of which the container 10 is comprised.

The present invention includes the additional advantage of being able to provide a container 10 with enhanced barrier properties that can be used for holding food products. Plastic containers having an inner surface treated with an amorphous carbon film have been approved for contact with food products from the Technische National Onderzoek, the standards organization accredited by the European Economic Community. The approval of the United States Food and Drug Administration (USFDA) is currently in process.

Figure 2:
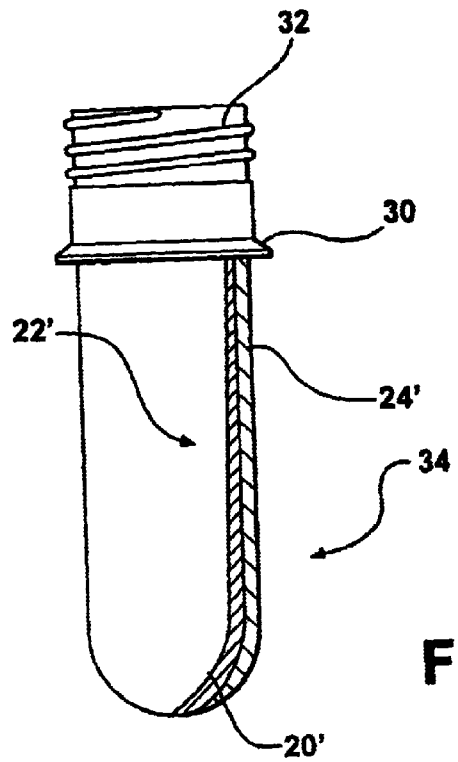
FIG. 2 is a partially broken away elevation view of one example of a multi-layer preform.

The container 10 of the present invention may be formed by any of several known processing techniques which permit the manufacture of a multi-layer blow molded container 10 having a plastic molded inner layer 20 and a relatively thick molded outer layer 24 of recycled plastic. In a preferred embodiment, the multi-layer container 10 is formed via a blow molding operation involving a multi-layer preform 34, such as the one generally depicted in FIG. 2. Although not a required feature, the preform 34 may include a neck flange 30 (for handling purposes) and outer threads 32 (to secure a closure) that correspond to the same features shown in FIG. 1. After the blow molding of the container 10, but some time before the filling operation, the inner surface 24 of the inner layer 20 of the container 10 is carbon-treated as further discussed below.

In a first preferred embodiment, the preform 34 is produced by extrusion molding an inner layer 20' and injection molding an outer layer 24'. The inner layer 20' and outer layer 24' of the preform 34 correspond to the inner layer 20 and outer layer 24 of the container 10. Extrusion of the inner layer 20' of the preform allows the manufacturer produce a thinner layer than is generally possible using conventional injection molding or co-injection processes. For example, the inner layer of an extrusion molded multi-layer preform 34 may be made as thin as 15–20 mils (0.381 mm to 0.508 mm) or less. Conversely, it is difficult, if not impossible, to reliably injection mold an inner layer having a comparable thickness profile. Further, an extrusion or co-extrusion process permits the manufacturer to readily vary the thickness of material being extruded along the length of the extrudate. Variations in the thickness of the inner layer is desirable for several reasons which include aesthetics, efficient material use and reduced costs, and variable strength requirements.

The outer layer 24' of the preform 34 is formed from a recycled plastic material and, in accordance with the present invention, is substantially thicker than the inner layer 20'. The outer layer 24' can be injection molded or compression molded over the inner layer 20', although injection molding is generally preferred. Such over-molding processes further permit the formation of a neck flange 30 and outer threads 32.

Figure 3:
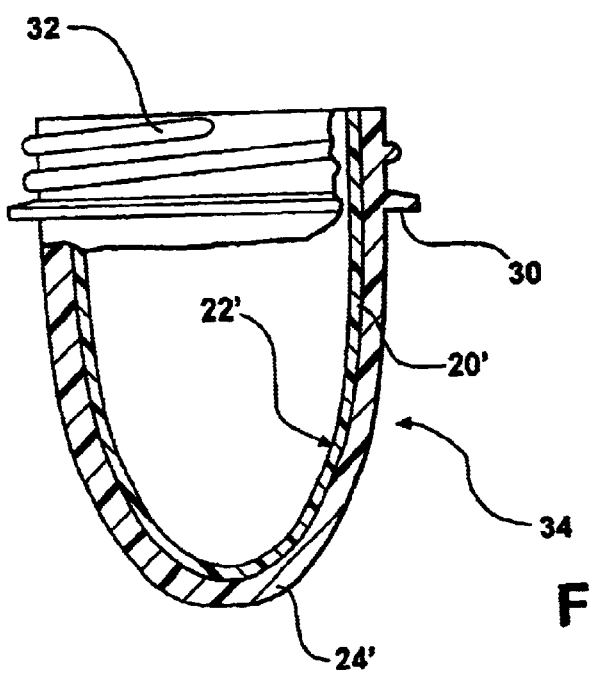
FIG. 3 is a partially broken away elevation view of another example of a multi-layer preform.

In a second preferred embodiment, the multi-layer preform 34 is produced by thermoforming a thin sheet of plastic material and forming that sheet into what will become the inner layer 20' of the preform 34. The process of thermoforming permits the formation of a preform 34 with a very thin inner layer 20'. In fact, minimum wall thicknesses of 3 mil (0.0762 mm) or less are possible. As in the case of an extruded inner layer 20', once the inner layer 20' of the preform 34 is formed, the outer layer 24' of recycled plastic can be injection or compression molded over the inner layer 20' to provide a multi-layer preform 34. FIG. 3 is a representative example of a preform 34 formed from a thermoformed inner layer 20 and injection molded outer layer 24. Preforms 34 formed in accordance with the principles of such second preferred embodiment are generally better suited for applications that require a wider opening 13 or dispensing mouth.

The multi-layer container can then be blown using conventional blow molding operations. Because the preform 34 will be stretched and "thinned-out" during the subsequent blow molding process, the thickness of the preform 34—at portions corresponding to like portions of the blown container—will inherently be somewhat thicker. In fact, the thickness of the various portions of the preform 34 are typically designed to take into account the amount of stretch and hoop expansion necessary to form the thickness profile desired in the final container 10. For clarity, hereinafter, the multi-layer containers having inner and outer layers 20,24 that have not been carbon-treated will be designated as 10' to distinguish them from containers 10 in which the inner surface 22 has been carbon coated.

After a container 10' having an inner layer 20 and outer layer 24 are produced, a carbon coating is formed on at least a portion of the inner surface 22 of the inner layer 20. The carbon coating 26 does not have to be immediately applied to the container, however, it is generally more efficient to apply the coating 26 promptly after the container 10' has been blown and is within an appropriate temperature profile.

In a preferred embodiment, the blown multi-layer containers 10' are removed from a conventional high-speed rotary blow-molding machine and subsequently transferred, directly or indirectly (i.e., via an intermediate handling steps), to an apparatus for applying a carbon coating 26 to the containers 10'. In high-speed production applications, the carbon-coating apparatus will typically also be of the rotary type. An example of such an apparatus that can be used to apply the carbon coating to the inner surface 22 of the containers 10' is available from Sidel of Le Havre, France and is commercially marketed under the "ACTIS" trade name.

A method for carbon-coating multi-layer containers 10' is next described in further detail. In accordance with a preferred method for carbon coating the inner surface 22 of the container 10,' a conventional carbon-coating or carbon-treating apparatus having rotary kinematics and a central vertical axis is provided. The carbon-coating apparatus generally rotates about its central vertical axis in a first rotational direction, e.g. counterclockwise, at a fairly high rotational speed. A blow-molding machine, or other rotary container transfer mechanism, located generally in close proximity to the carbon-coating apparatus functions as the source of containers 10' for subsequent carbon-coating treatment. To facilitate the transfer, the rotary container transfer mechanism rotates in a direction opposed to the rotational direction of the carbon-coating apparatus—e.g., clockwise—and the multi-layer containers 10' are mechanically shifted from the container transfer mechanism to the carbon-coating apparatus. Although not required for the practice of the present invention, the container 10' preferably includes a neck flange 30 or other physical means for at least partially supporting the container 10' during the mechanical transfer process.

As the containers 10' are transferred from the transfer mechanism to the carbon-coating apparatus, the containers 10' are preferably held by the upper portion 12 in an upright orientation with the opening 13 generally facing upwardly. If desired, a vacuum can also be generated and used to support or partially support the container 10'. During the transfer process, the individual containers 10' are received by a receiving mechanism which is part of the carbon-coating apparatus. The receiving mechanism revolves around the central axis of the carbon-coating apparatus, grasps or secures the container 10', and seals the opening 13 of the upper portion 12 of the container 10', much like a lid. When properly positioned over and abutting the opening 13, the receiving mechanism produces a tight to "airtight" seal over the container 10'.

The receiving mechanism includes at least two apertures positioned above the opening 13 of the container 10' that are used for the introduction and removal of gases from the inside of the container 10'. A first aperture in the receiving mechanism is in communication with a vacuum source, such as a vacuum pump. After the receiving mechanism has securely sealed the opening 13, the air within the container 10' is discharged through the first aperture by means of a vacuum. It is desirable that degree of vacuum falls within a range of about $10^{-2}$ to $10^{-5}$ torr, so as to shorten the discharge time for a vacuum and saves necessary energy therefor. With a lower degree of vacuum of over $10^{-2}$ torr, impurities in the container are much increased, on the other hand, with a higher degree of vacuum under $10^{-5}$ torr, increased time and a large energy are needed to discharge the air in the container 10'.

Once the air inside the container 10' has been evacuated, the container 10' is subsequently filled or "charged" with a raw gas that will be used in the formation of the carbon coating 26. The flow rate of the raw gas is preferably within a range from about 1 to 100 ml/min. Preferably, the diffusion of the raw gas within the container 10' is enhanced by providing an extension, such as a tube having a plurality of blowing openings. In accordance with one embodiment, an extension enters inside of the container 10' through the second aperture some time after the opening 13 is sealed and the extension extends to within about 25.4 mm to 50.8 mm (1.0 in.–2.0 in.) of the lowermost portion of the container 10'.

The raw gas may be comprised of aliphatic hydrocarbons, aromatic hydrocarbons, oxygen containing hydrocarbons, nitrogen containing hydrocarbons, etc., in gaseous or liquid state at a room temperature. Benzene, toluene, o-xylene, m-xylene, p-xylene and cyclohexane each having six or more than six carbons are preferable. The raw gases may be used singularly, but a mixture of two or more than two kinds of raw gases can also be used. Moreover, the raw gases may be used in the state of dilution with inert gas such as argon and helium.

At some point after the container 10' has been received by the receiving mechanism of the carbon-coating apparatus, the container 10' is inserted into a cylinder or other hollow space provided to accommodate the container 10'. In the preferred embodiment, the carbon-coating apparatus includes a plurality of hollow cylinders that rotate in the same direction as, and in synchronization with, the receiving mechanism. It is further preferred that the receiving mechanism that retains and seals the opening 13 of the container 10' also functions to cover the cylinder.

After the supply of the raw gas into the container, energy is impressed upon the container 10' from a high frequency electric energy source, such as a micro-wave-producing device. The impression of the electric power generates plasma, and causes extreme molecular excitation ionization and a carbon coating 26 to be formed on the inner surface 22 of the container 10'.

While the foregoing method illustrates one process for forming a carbon coating 26 on the inner surface 22 of a container 10', other conventional methods can also be used successfully. For instance, the plastic container 10' could instead be inserted and accommodated within an external electrode and have an internal electrode positioned within the container 10'. After the container 10' is evacuated and is charged with raw gas supplied through the internal electrode, electric power is supplied from the high frequency electric source to the external electrode. The supply of electric power generates plasma between the external electrode and the internal electrode. Because the internal electrode is earthed, and the external electrode is insulated by the insulating member, a negative self-bias is generated on the external electrode, so that carbon film is formed uniformly on the inner surface of the container along the external electrode.

When the plasma is generated between the external electrode and the internal electrode, electrons are accumulated on the inner surface of the insulated external electrode to electrify negatively the external electrode, to generate negative self-bias on the external electrode. At the external electrode, a voltage drop occurs because of the accumulated electrons. At this time, carbon dioxide as the carbon resource exists in the plasma, and positively ionized carbon resource gas is selectively collided with the inner surface 22 of the container 10' which is disposed along the external electrode, and, then, carbons close to each other are bonded together thereby to form hard carbon film comprising remarkably dense coating on the inner surface 22 of the container 10'.

The thickness and uniformity of the carbon coating 26 can be varied by adjusting the output of high frequency; the pressure of the raw gas in the container 10'; the flow rate for charging the container 10' with gas; the period of time during which plasma is generated; the self-bias and kind of raw materials used; and other like variables. However, the thickness of the carbon coating 26 is preferably within a range from 0.05 to 10 $\mu$m to obtain the effective suppression of the permeation and/or absorption of the low molecular organic compound and the improved gas barrier property, in addition to an excellent adhesion to plastic, a good durability and a good transparency.

Although certain preferred embodiments of the present invention have been described, the invention is not limited to the illustrations described and shown herein, which are deemed to be merely illustrative of the best modes of carrying out the invention. A person of ordinary skill in the art will realize that certain alternatives, modifications, and variations will come within the teachings of this invention and that such alternatives, modifications, and variations are within the spirit and the broad scope of the appended claims.

What is claimed is:

1. A method of manufacturing a multi-layer container coated with a carbon coating, which comprises:
   providing a multi-layered container including an upper wall portion having an opening, an intermediate side wall portion positioned beneath the upper wall portion, a base portion positioned beneath the intermediate wall portion, and a central vertical axis, said container further including a plastic inner layer having a vertical length and an inner surfaces, and an outer layer including recycled plastic having a vertical length and an inner surface that is substantially coextensive with the inner layer, wherein the inner layer has a thickness that is between 0.022 an 0.833 of the thickness of the outer layer at corresponding points taken along the vertical lengths of the inner layer and the outer layer, the outer layer comprises at least 0.40 of the overall weight of the container, and the outer layer is in a contacting relationship with the inner layer along substantially the entire inner surface of the outer layer;
   enclosing the multi-layered container within a hollow space provided to accommodate the container;
   discharging the air within the container and creating a vacuum;
   charging the internal volume of the container with raw gas; and
   forming a carbon coating from said raw gas on the inner surface of the inner layer of the container, wherein the carbon coating has a thickness that is less than 10 $\mu$m.

2. A method according to claim 1, wherein the multi-layered container is formed by extruding a plastic sleeve from a thermoplastic material; injection molding an outer layer over the sleeve to form a preform; and blow molding the preform to form a multi-layer container.

3. A method according to claim 1, including the step of varying the thickness of the inner layer along its vertical length.

4. A method according to claim 1, including providing that the inner layer includes a material selected from the group consisting of a barrier material, an oxygen-scavenging material, and a material that is a combination of a barrier and an oxygen-scavenger.

5. A method according to claim 1, including charging the internal volume of the container with said raw gas selected from the group consisting of aliphatic hydrocarbons, aromatic hydrocarbons, oxygen containing hydrocarbons, and mixtures of two or more of such gases.

6. A method according to claim 1, wherein the formation of the carbon coating on the inner surface of the container is induced by a high frequency electric source.

7. A method according to claim 6, including providing that the high frequency electric source includes an internal electrode and an insulated external electrode for generating negative self-bias.

8. A method according to claim 1, wherein the formation of carbon coating on the inner surface of t e container is induced by a microwave.

9. A method according to claim 1, including providing that the outer layer comprises at least 0.90 by weight of the overall weight of the container.

10. A method according to claim 1, including the step of forming the carbon coating with a substantially uniform thickness.

11. A method according to claim 1, including providing that the inner layer has a wall thickness taken along its vertical length that is within the range of about 0.5 mil to about 5 mil and the outer layer has a wall thickness taken along its vertical length that is within the range of about 6.0 mils to a out 23 mils.

12. A method according to claim 1, including forming a carbon coating that is amorphous.

13. A method according to claim 1, including the step of forming the carbon coating with the weight of the carbon coating being less than about $\frac{1}{10,000}^{th}$ of the total weight of the container.

14. A method according to claim 1, wherein the thickness of the inner layer and outer layer are controllably varied with respect to one another.

15. A method according to claim 1, wherein the step of forming the carbon coating on the inner surface f the inner layer of the container includes the rotation of the container about the central vertical axis.

16. A method according to claim 15, wherein the rotation includes high-speed rotation.

17. A method according to claim 1, including a transferring process for handling the container.

18. A method according to claim 17, wherein the transferring process includes rotation of the container.

19. A method according to claim 15, including a transferring process for handling the container with rotation of the container during the transferring process, the rotation of the transfer process is in a direction opposed to the direction of rotation of the container during the carbon coating of the inner surface of the inner layer.

20. A method according to claim 1, including the step of providing a receiving mechanism to seal the opening of the container to produce a substantially air-tight seal prior to the complete discharging of the air within the container.

21. A method according to claim 20, including securing the container with respect to the receiving mechanism and revolving the receiving mechanism around the central axis of the container.

22. A method according to claim 20, including the step of providing that the receiving mechanism includes at least two apertures for the communication of gases.

23. A method according to claim 20, including the step of providing that the receiving mechanism is in communication with a vacuum source.

24. A method according to claim 1, wherein the vacuum created is within the range of about $10^{-2}$ to $10^{-5}$ torr.

25. A method according to claim 1, including the step of providing that the flow rate for charging the internal volume of the container with said raw gas is within the range from about 1 to 100 ml/mm.

26. A method according to claim 1, including using high frequency electric power on the gas to control the thickness of the carbon coating on the inner surface of the inner layer.

* * * * *

UNITED STATES PATENT AND TRADEMARK OFFICE
CERTIFICATE OF CORRECTION

PATENT NO. : 6,645,575 B1 Page 1 of 1
DATED : November 11, 2003
INVENTOR(S) : William A. Slat It is certified that error appears in the above-identified patent and that said Letters Patent is hereby corrected as shown below:

Column 9,
Line 42, after "inner" please delete "surfaces" and replace with -- surface --.
Line 46, after "0.22" please delete "an" and replace with -- and --.
Line 48, please delete "lengths" and replace with -- length --.

Column 10,
Line 23, after "surface of" please delete "t e" and replace with -- the --.
Line 37, after "to" please delete "a out" and replace with -- about --.
Line 48, after "surface" please delete "f" and insert -- of --.
Please cancel claim 16. This claim was cancelled during the prosecution of this application.

Column 12,
Line 6, after "ml/" please delete "mm" and replace with -- min --.

Signed and Sealed this

Third Day of February, 2004

JON W. DUDAS
*Acting Director of the United States Patent and Trademark Office*